United States Patent
Mei et al.

(10) Patent No.: US 12,507,562 B2
(45) Date of Patent: Dec. 23, 2025

(54) DISPLAY PANEL, DISPLAY DEVICE AND MASK

(71) Applicants: Chengdu BOE Optoelectronics Technology Co., Ltd., Sichuan (CN); BOE TECHNOLOGY GROUP CO., LTD., Beijing (CN)

(72) Inventors: Ju Mei, Beijing (CN); Jianpeng Wu, Beijing (CN); Xilei Cao, Beijing (CN); Tiaomei Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 639 days.

(21) Appl. No.: 17/911,737

(22) PCT Filed: Oct. 26, 2021

(86) PCT No.: PCT/CN2021/126262
§ 371 (c)(1),
(2) Date: Sep. 15, 2022

(87) PCT Pub. No.: WO2022/213581
PCT Pub. Date: Oct. 13, 2022

(65) Prior Publication Data
US 2024/0224685 A1    Jul. 4, 2024

(30) Foreign Application Priority Data

Apr. 9, 2021 (CN) .......................... 202110382431.9

(51) Int. Cl.
*H10K 59/35* (2023.01)
*C23C 14/04* (2006.01)
(Continued)

(52) U.S. Cl.
CPC ......... *H10K 59/353* (2023.02); *C23C 14/042* (2013.01); *C23C 14/24* (2013.01); *H10K 59/352* (2023.02); *H10K 71/166* (2023.02)

(58) Field of Classification Search
CPC .... C23C 14/042; C23C 14/24; H10K 59/352; H10K 59/353; H10K 71/166
See application file for complete search history.

(56) References Cited

U.S. PATENT DOCUMENTS 10,446,620 B2 * 10/2019 Jun ................. H10K 59/38
11,367,752 B2 *  6/2022 Du ..................... C23C 14/12
(Continued)

FOREIGN PATENT DOCUMENTS

CN        105448951 A     3/2016
CN        113130609 A     7/2021

*Primary Examiner* — Jaehwan Oh
(74) *Attorney, Agent, or Firm* — HOUTTEMAN LAW LLC (57) ABSTRACT

There is provided a display panel, including: pixel units arranged in an array; each pixel unit includes a first sub-pixel, a second sub-pixel and a third sub-pixel emitting light of different colors and having areas sequentially increased; along a column direction of the array, for any adjacent pixel units, the second sub-pixel of the former pixel unit is arranged adjacent to the first sub-pixel of the latter pixel unit; third sub-pixels in the adjacent pixel units are arranged in sequence; a minimum distance and a maximum distance exist between the third sub-pixels adjacent to each other in the adjacent pixel units; for any adjacent pixel units, the second sub-pixel of the former pixel unit and the first sub-pixel of the latter pixel unit, which are adjacent to each other, are kept apart by a first distance being greater than the minimum distance and less than the maximum distance.

19 Claims, 9 Drawing Sheets

(51) Int. Cl.
*C23C 14/24* (2006.01)
*H10K 71/16* (2023.01)

(56) References Cited

U.S. PATENT DOCUMENTS

| | | | | |
|---|---|---|---|---|
| 2014/0319484 | A1* | 10/2014 | Kwon | H10K 59/352 |
| | | | | 257/40 |
| 2016/0063911 | A1* | 3/2016 | Wu | G09G 3/3208 |
| | | | | 345/77 |
| 2016/0240592 | A1* | 8/2016 | Li | H10K 59/353 |
| 2018/0097043 | A1* | 4/2018 | Song | H10K 59/122 |
| 2019/0006430 | A1* | 1/2019 | Jun | G09G 3/3233 |
| 2019/0074329 | A1* | 3/2019 | Kim | H10K 59/353 |
| 2020/0357325 | A1* | 11/2020 | Zhao | G09G 3/2003 |
| 2021/0280644 | A1* | 9/2021 | Du | H10K 59/353 |

* cited by examiner

DISPLAY PANEL, DISPLAY DEVICE AND MASK

TECHNICAL FIELD

Embodiments of the present disclosure belong to the field of display technology, and particularly relates to a display panel, a display device and a mask.

BACKGROUND

An organic Light-Emitting Diode (OLED) display panel adopting the OLED display technology has become a mainstream development trend in the field of display technology due to its advantages of self-luminescence, high brightness, good image quality and low power consumption.

The OLED display panel includes a plurality of sub-pixels configured to emit light in different colors; and the OLED display panel includes a plurality of pixel units, each of which is composed of a plurality of sub-pixels in different colors, and a color of each pixel unit of the display panel can be obtained by adjusting brightnesses of the sub-pixels. Each of the sub-pixels in different colors is formed by evaporating an organic light-emitting material with a high precision mask.

SUMMARY

The embodiments of the present disclosure provide a display panel, a display device and a mask.

In a first aspect, an embodiment of the present disclosure provides a display panel, including: a plurality of pixel units arranged in an array;
  each of the pixel units includes a first sub-pixel, a second sub-pixel and a third sub-pixel; and the first sub-pixel, the second sub-pixel and the third sub-pixel emit light of different colors and have areas sequentially increased;
  along a column direction of the array, for any adjacent pixel units, the second sub-pixel of the former pixel unit is arranged adjacent to the first sub-pixel of the latter pixel unit; and third sub-pixels in the adjacent pixel units are arranged in sequence;
  along the column direction of the array, for any adjacent pixel units, a minimum distance and a maximum distance exist between the third sub-pixels adjacent to each other in the adjacent pixel units; and the second sub-pixel of the former pixel unit and the first sub-pixel of the latter pixel unit, which are adjacent to each other, are kept apart by a first distance; and
  the first distance is greater than the minimum distance and less than the maximum distance.

In some implementations, each of the pixel units includes a sub-unit;
  the sub-unit includes one first sub-pixel, one second sub-pixel and one third sub-pixel; the first sub-pixel and the second sub-pixel are arranged along the column direction of the array to form a first sub-column; a length direction of the third sub-pixel is along the column direction of the array, and forms a second sub-column; and the first sub-column and the second sub-column are arranged along a row direction of the array.

In some implementations, each of the pixel units includes one, two or more sub-units; and
  the two or more sub-units are arranged along the column direction of the array.

In some implementations, within each sub-unit, the first sub-pixel and the second sub-pixel are kept apart by the first distance; the first sub-pixel and the third sub-pixel are kept apart by the first distance; and the second sub-pixel and the third sub-pixel are kept apart by the first distance.

In some implementations, for any adjacent sub-units within each of the pixel units, the first sub-pixel in the former sub-unit and the second sub-pixel of the latter sub-unit are adjacent to each other and kept apart by the first distance; and the third sub-pixel of the former sub-unit and the third sub-pixel of the latter sub-unit are kept apart by a second distance, which is less than the minimum distance.

In some implementations, for any adjacent sub-units within each of the pixel units, the third sub-pixel of the former sub-unit and the third sub-pixel of the latter sub-unit are mirror symmetrical.

In some implementations, each of the pixel units includes a first sub-unit and a second sub-unit, which are arranged along the column direction of the array;
  the first sub-unit includes two first sub-pixels and one third sub-pixel;
  the second sub-unit includes two second sub-pixels and one third sub-pixel;
  within the first sub-unit, the two first sub-pixels are arranged along the column direction of the array to form a first sub-column; a length direction of the third sub-pixel is along the column direction of the array to form a second sub-column; and the first sub-column and the second sub-column are arranged along a row direction of the array;
  within the second sub-unit, the two second sub-pixels are arranged along the column direction of the array to form a third sub-column; a length direction of the third sub-pixel is along the column direction of the array to form a fourth sub-column; and the third sub-column and the fourth sub-column are arranged along the row direction of the array; and
  the first sub-column and the third sub-column are located in a same column; and the second sub-column and the fourth sub-column are located in a same column.

In some implementations, the first sub-pixel in the first sub-unit and the second sub-pixel in the second sub-unit are kept apart by the first distance;
  within the first sub-unit, each of the first sub-pixel is kept apart from the third sub-pixel by the first distance; and
  within the second sub-unit, each of the second sub-pixel is kept apart from the third sub-pixel by the first distance.

In some implementations, the two first sub-pixels in the first sub-unit are kept apart by a third distance;
  the two second sub-pixels in the second sub-unit are kept apart by a fourth distance; and the third sub-pixel in the first sub-unit and the third sub-pixel in the second sub-unit are kept apart by a fifth distance.

In some implementations, each of the third distance, the fourth distance and the fifth distance is less than the minimum distance.

In some implementations, each of the third distance, the fourth distance and the fifth distance is equal to the first distance.

In some implementations, the two first sub-pixels in the first sub-unit are mirror symmetrical;
  the two second sub-pixels in the second sub-unit are mirror symmetrical; and
  the third sub-pixel in the first sub-unit and the third sub-pixel in the second sub-unit are mirror symmetrical.

In some implementations, each of the pixel units includes a plurality of first sub-units and a plurality of second sub-units, and the first sub-units and the second sub-units are alternately arranged along the column direction of the array.

In some implementations, the third sub-pixels adjacent to each other in the adjacent pixel units are mirror symmetrical.

In some implementations, a shape of an orthographic projection of the first sub-pixel on the display panel includes a rectangle, a triangle, a diamond or a trapezoid; a shape of an orthographic projection of the second sub-pixel on the display panel includes a rectangle, a triangle, a diamond or a trapezoid; and a shape of an orthographic projection of the third sub-pixel on the display panel includes a rectangle, a triangle, a diamond, a trapezoid, a polygon or an irregular shape.

In some implementations, the display panel further includes a plurality of supporters, which are respectively disposed at positions where the maximum distance exists between the third sub-pixels adjacent to each other in the adjacent pixel units along the column direction of the array.

In some implementations, a shape of an orthographic projection of each of the supporters on the display panel includes a rectangle, a circle, an ellipse, a triangle, a trapezoid, a regular polygon or an irregular shape.

In some implementations, each of the first sub-pixel, the second sub-pixel and the third sub-pixel includes an anode layer, a light-emitting functional layer and a cathode layer, which are sequentially stacked;
  anode layers of the first sub-pixel, the second sub-pixel and the third sub-pixel are independent of one another, light-emitting functional layers of the first sub-pixel, the second sub-pixel and the third sub-pixel are independent of one another, and cathode layers of the first sub-pixel, the second sub-pixel and the third sub-pixel are connected into one piece; and
  shapes of orthographic projections of the anode layers of the first sub-pixel, the second sub-pixel and the third sub-pixel on the display panel are respectively the same as those of orthographic projections of the first sub-pixel, the second sub-pixel and the third sub-pixel on the display panel.

In a second aspect, an embodiment of the present disclosure further provides a display device, including the display panel described above.

In a third aspect, an embodiment of the present disclosure further provides a mask, including a base;
  a plurality of first openings are formed in the base;
  or a plurality of second openings are formed in the base;
  or a plurality of third openings are formed in the base;
  each of the plurality of first openings corresponds to one of first sub-pixels in each pixel unit; or each of the plurality of first openings corresponds to all the first sub-pixels in each pixel unit;
  each of the plurality of second openings corresponds to one of second sub-pixels in each pixel unit; or each of the plurality of second openings corresponds to all the second sub-pixels in each pixel unit; and
  each of the plurality of third openings corresponds to one of third sub-pixels in each pixel unit; or each of the plurality of third openings corresponds to all the third sub-pixels in each pixel unit.

BRIEF DESCRIPTION OF DRAWINGS

The accompanying drawings are used to provide a further understanding of the embodiments of the present disclosure, and constitute a part of the specification. The drawings are used to explain the present disclosure in conjunction with the embodiments of the present disclosure, but do not constitute any limitation to the present disclosure. The above and other features and advantages will become more apparent to those of ordinary skill in the art through the description of specific exemplary embodiments with reference to the drawings. In the drawings.

DETAIL DESCRIPTION OF EMBODIMENTS

In order to enable those of ordinary skill in the art to better understand the technical solutions of the embodiments of the present disclosure, a display panel, a display device and a mask provided by the embodiments of the present disclosure are further described in detail below with reference to the drawings and specific implementations.

The embodiments of the present disclosure will be described more fully below with reference to the drawings, but the embodiments illustrated herein may be embodied in different forms and should not be interpreted as any limitation. Rather, the embodiments are provided to make the present disclosure thorough and complete, and are intended to enable those of ordinary skill in the art to fully understand the scope of the present disclosure.

The embodiments of the present disclosure are not limited to those illustrated by the drawings, but include modifications to configuration formed based on a manufacturing process. Thus, the regions shown in the drawings are illustrative, and the shapes of the regions shown in the drawings illustrate specific shapes of the regions, but are not intended to make limitations.

Figure 1:
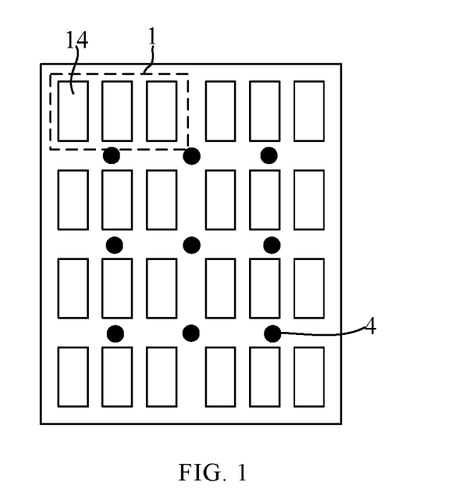
FIG. 1 is a top view of a layout structure of sub-pixels in pixel units of an OLED display panel in the related art.
Figure 2:
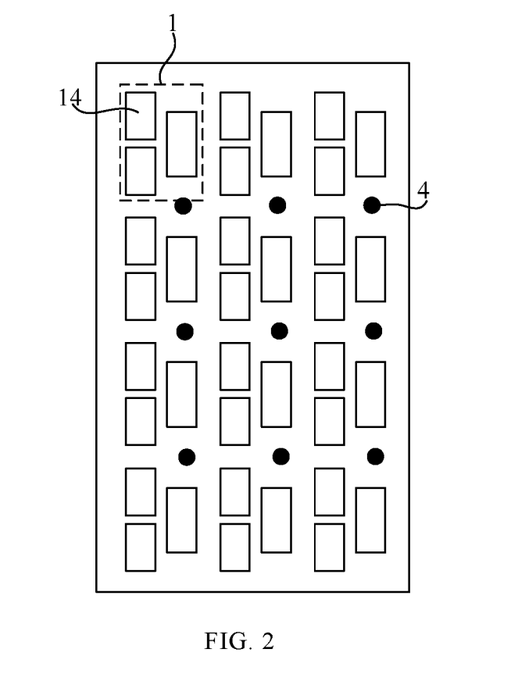
FIG. 2 is a top view of another layout structure of sub-pixels in pixel units of an OLED display panel in the related art.

With reference to FIG. 1 and FIG. 2, an OLED display panel in the related art includes a plurality of pixel units 1, each of the pixel units 1 includes three sub-pixels 14 including a red sub-pixel, a green sub-pixel and a blue sub-pixel, the three sub-pixels 14 have a same shape, and a shape of an orthographic projection of each of the three sub-pixels 14 is generally a rectangle. The red sub-pixel 14, the green sub-pixel 14 and the blue sub-pixel 14 in each pixel unit 1 are arranged along a straight line, or are arranged in such a way that lines connecting positions of the red sub-pixel 14, the green sub-pixel 14 and the blue sub-pixel 14 may form a triangle. The red sub-pixel 14, the green sub-pixel 14 and the blue sub-pixel 14 in each pixel unit 1 are kept apart by a relatively large distance, and any adjacent pixel units 1 are kept apart by a relatively large distance too. Any adjacent sub-pixels 14 in the adjacent pixel units 1 are kept apart by a same distance (that is, a single-sized distance).

Due to the above arrangement of the pixel units of the OLED display panel, presentation of a solid color (R/G (red/green)) image is poor, visual resolution is not guaranteed, diagonal continuity is poor, and a single-pixel black/white point cannot be displayed; moreover, an opening area of each sub-pixel in the pixel units is limited, which causes high process difficulty in fabrication and tensioning of a mask used for evaporation of a light-emitting functional layer.

In addition, supporters 4 are disposed between the adjacent pixel units 1 in the OLED display panel, and are configured to prevent a substrate to be evaporated from adhering to the mask during the evaporation of the light-emitting functional layer; a relatively large distance is to be arranged between the adjacent pixel units 1 for disposing the supporters 4; and an area of an orthographic projection of each supporter 4 on the display panel is relatively large, so that the supporters 4 are easily to be scratched by the mask, and the scratch easily causes a contamination defect.

Figure 3:
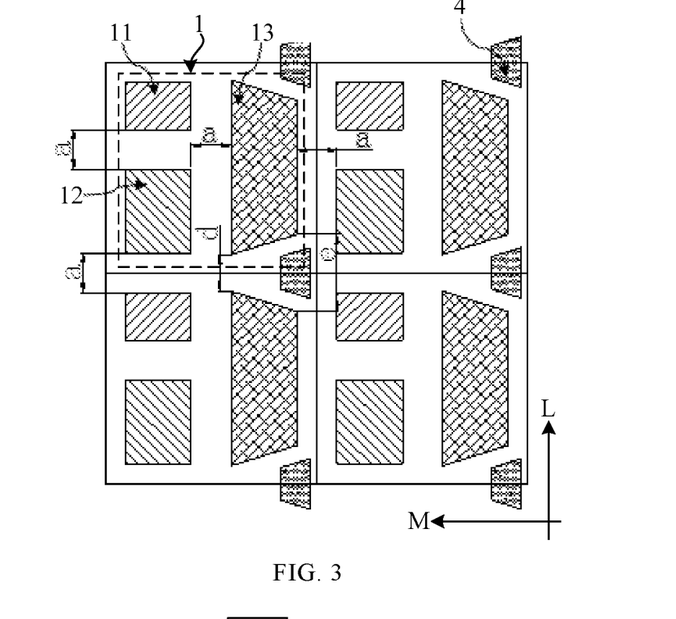
FIG. 3 is a top view of a layout structure of pixel units of a display panel according to the embodiments of the present disclosure.

In view of the above technical problems of the OLED display panel in the related art, an embodiment of the present disclosure provides a display panel, and with reference to FIG. 3, the display panel includes: a plurality of pixel units 1 arranged in an array; each of the pixel units 1 includes a first sub-pixel 11, a second sub-pixel 12 and a third sub-pixel 13; the first sub-pixel 11, the second sub-pixel 12 and the third sub-pixel 13 emit light of different colors and have areas sequentially increased; along a column direction L of the array, for any adjacent pixel units 1, the second sub-pixel 12 of the former pixel unit 1 is arranged adjacent to the first sub-pixel 11 of the latter pixel unit 1; the third sub-pixels 13 adjacent to each other in the adjacent pixel units 1 are arranged in sequence; along the column direction L of the array, a minimum distance d and a maximum distance e exist between the third sub-pixels 13 adjacent to each other in the adjacent pixel units 1; for any adjacent pixel units 1, the second sub-pixel 12 of the former pixel unit 1 and the first sub-pixel 11 of the latter pixel unit 1, which are adjacent to each other, are kept apart by a first distance a; and the first distance a is greater than the minimum distance d and less than the maximum distance e.

The third sub-pixel 13 with the largest area has the lowest luminous efficiency, the first sub-pixel 11 with the smallest area has the highest luminous efficiency, and luminous efficiency of the second sub-pixel 12 with an area between the area of the first sub-pixel 11 and the area of the third sub-pixel 13 is between the luminous efficiency of the third sub-pixel 13 and the luminous efficiency of the first sub-pixel 11. In practical applications, the first sub-pixel 11, the second sub-pixel 12 and the third sub-pixel 13 are a red sub-pixel, a green sub-pixel and a blue sub-pixel, respectively. In the embodiment, the third sub-pixel 13 adjacent to each other in the adjacent pixel units 1 refers to that the third sub-pixel 13 of the former pixel unit 1 is adjacent to the third sub-pixel 13 of the latter pixel unit 1. The minimum distance d and the maximum distance e exiting between the third sub-pixels 13 adjacent to each other in the adjacent pixel units 1 indicates that the distance between the third sub-pixels 13 adjacent to each other in the adjacent pixel units 1 is not constant, i.e., is not equal to a single size, so that a shape of the third sub-pixel 13 is no longer the regular rectangle defined in the related art. For any adjacent pixel units 1, the second sub-pixel 12 of the former pixel unit 1 and the first sub-pixel 11 of the latter pixel unit 1, which are adjacent to each other, being kept apart by the first distance a indicates that the distance between the second sub-pixel 12 of the former pixel unit 1 and the first sub-pixel 11 of the latter pixel unit 1 is constant, i.e., is equal to a single size.

Figure 4:
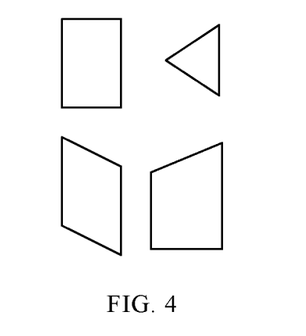
FIG. 4 is a schematic diagram showing shapes of a first sub-pixel and a second sub-pixel according to the embodiments of the present disclosure.
Figure 5:
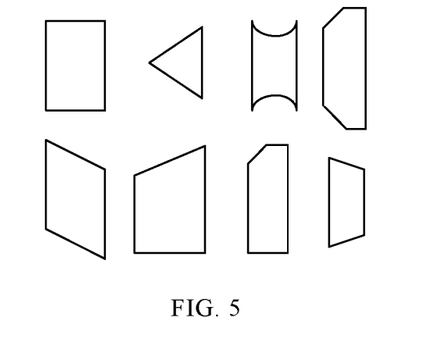
FIG. 5 is a schematic diagram showing a shape of a third sub-pixel according to the embodiments of the present disclosure.

In some implementations, with reference to FIG. 4, a shape of an orthographic projection of each first sub-pixel 11 on the display panel includes a rectangle, a triangle, a diamond or a trapezoid; a shape of an orthographic projection of each second sub-pixel 12 on the display panel includes a rectangle, a triangle, a diamond or a trapezoid; and with reference to FIG. 5, a shape of an orthographic projection of each third sub-pixel 13 on the display panel includes a rectangle, a triangle, a diamond, a trapezoid, a polygon or an irregular shape.

In some implementations, with reference to FIG. 3, the shape of the orthographic projection of the first sub-pixel 11 on the display panel is a rectangle, the shape of the orthographic projection of the second sub-pixel 12 on the display panel is a rectangle, and the shape of the orthographic projection of the third sub-pixel 13 on the display panel is a trapezoid. Both a shorter base and a longer base of the trapezoid extend along the column direction L of the array. A pair of opposite sides of the rectangle extends along the column direction L of the array, and another pair of opposite sides of the rectangle is along a row direction M of the array.

In some implementations, with reference to FIG. 3, the minimum distance d between the third sub-pixels 13 adjacent to each other in the adjacent pixel units 1 is a distance between adjacent endpoints of longer bases of the third sub-pixels 13 adjacent to each other. The maximum distance e between the third sub-pixels 13 adjacent to each other in the adjacent pixel units 1 is a distance between adjacent endpoints of shorter bases of the third sub-pixels 13 adjacent to each other. For any adjacent pixel units 1, the first distance a between the second sub-pixel 12 of the former pixel unit 1 and the first sub-pixel 11 of the latter pixel unit 1, which are adjacent to each other, is a distance between adjacent parallel sides of the second sub-pixel 12 of the former pixel unit 1 and the first sub-pixel 11 of the latter pixel unit 1, with the adjacent parallel sides being along the row direction M of the array.

Figure 6:
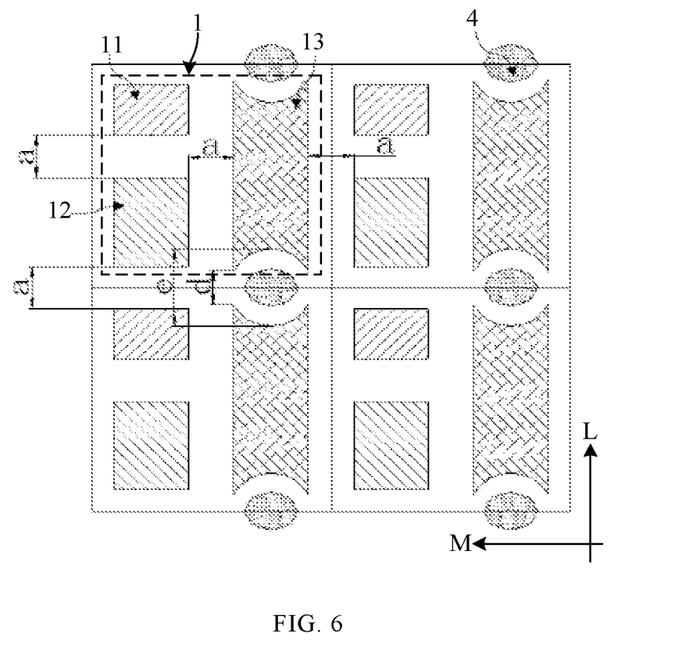
FIG. 6 is a top view of another layout structure of pixel units of a display panel according to the embodiments of the present disclosure.

In some implementations, with reference to FIG. 6, the shape of the orthographic projection of the first sub-pixel 11 on the display panel is a rectangle, the shape of the orthographic projection of the second sub-pixel 12 on the display panel is a rectangle, and the shape of the orthographic projection of the third sub-pixel 13 on the display panel is an irregular quadrilateral; and a pair of opposite sides of the irregular quadrilateral are straight sides which are parallel to each other and extend along the column direction L of the array, and another pair of opposite sides of the irregular quadrilateral are curved sides which are concave in opposite directions along the column direction L of the array. A pair of parallel opposite sides of the rectangle is along the column direction L of the array, and another pair of parallel opposite sides of the rectangle is along the row direction M of the array.

In some implementations, with reference to FIG. 6, the minimum distance d between the third sub-pixels 13 adjacent to each other in the adjacent pixel units 1 is a distance between two points, which have a minimum distance therebetween along the column direction L of the array, at two adjacent curved sides of the third sub-pixels 13 adjacent to each other. The maximum distance e between the third sub-pixels 13 adjacent to each other in the adjacent pixel units 1 is a distance between two points, which have a maximum distance therebetween along the column direction L of the array, at the two adjacent curved sides of the third sub-pixels 13 adjacent to each other. For any adjacent pixel units 1, the first distance a between the second sub-pixel 12 of the former pixel unit 1 and the first sub-pixel 11 of the latter pixel unit 1, which are adjacent to each other, is a distance between adjacent parallel sides of the second sub-pixel 12 of the former pixel unit 1 and the first sub-pixel 11 of the latter pixel unit 1, with the adjacent parallel sides being along the row direction M of the array.

Figure 7:
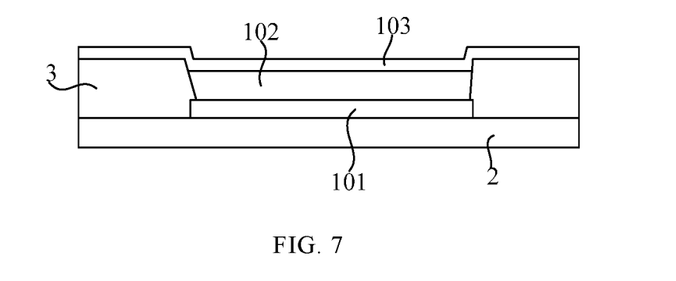
FIG. 7 is a sectional view of each sub-pixel of a display panel according to the embodiments of the present disclosure.

In some implementations, with reference to FIG. 7, the display panel includes a driving backplane 2 and a pixel defining layer 3 disposed thereon, and the pixel defining layer 3 defines a plurality of pixel regions in which the sub-pixels are disposed. Each of the first sub-pixel, the second sub-pixel and the third sub-pixel includes an anode layer 101, a light-emitting functional layer 102 and a cathode layer 103, which are sequentially stacked; anode layers 101 of the first sub-pixel, the second sub-pixel and the third sub-pixel are independent of one another, light-emitting functional layers 102 of the first sub-pixel, the second sub-pixel and the third sub-pixel are independent of one another, and cathode layers 103 of the first sub-pixel, the second sub-pixel and the third sub-pixel are connected into one piece; and shapes of orthographic projections of the anode layers 101 of the first sub-pixel, the second sub-pixel, and the third sub-pixel on the display panel are respectively the same as those of the orthographic projections of the first sub-pixel, the second sub-pixel, and the third sub-pixel on the display panel.

Figure 8A:
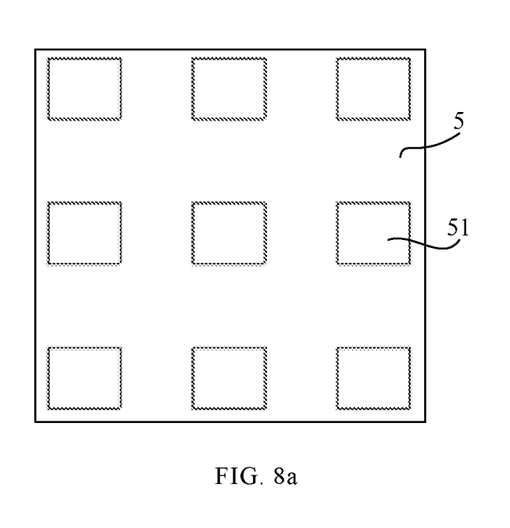
FIG. 8a is a schematic diagram of opening patterns of a mask for evaporation of light-emitting functional layers of first sub-pixels shown in FIG. 3.
Figure 8B:
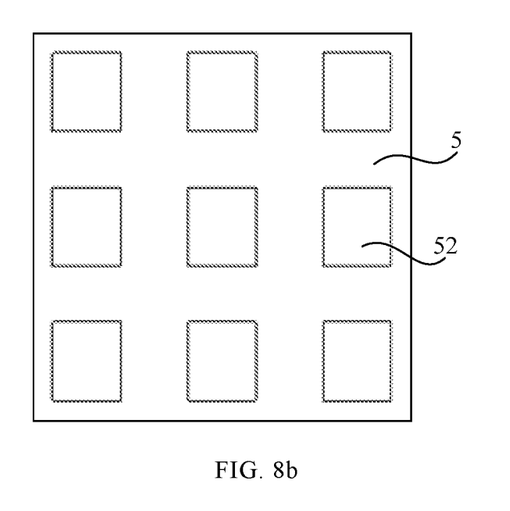
FIG. 8b is a schematic diagram of opening patterns of a mask for evaporation of light-emitting functional layers of second sub-pixels shown in FIG. 3.
Figure 8C:
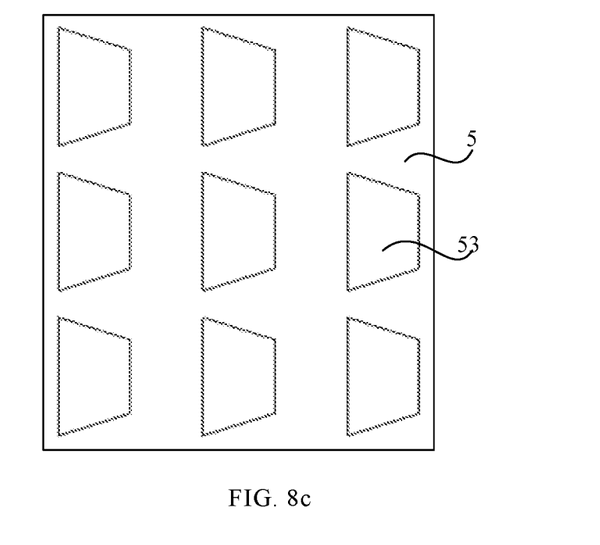
FIG. 8c is a schematic diagram of opening patterns of a mask for evaporation of light-emitting functional layers of third sub-pixels shown in FIG. 3.
Figure 8D:
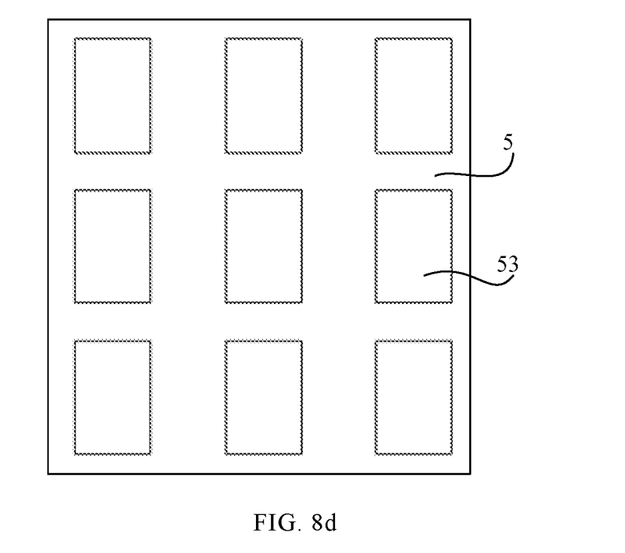
FIG. 8d is a schematic diagram of opening patterns of a mask for evaporation of light-emitting functional layers of third sub-pixels shown in FIG. 3 and FIG. 6.

In some implementations, with reference to FIG. 8*a* to FIG. 8*d*, opening patterns of a mask for evaporation of the light-emitting functional layers 102 of the first sub-pixels and the second sub-pixels may be rectangles; and opening patterns of a mask for evaporation of the light-emitting functional layers 102 of the third sub-pixels may be trapezoids shown in FIG. 8*c*, or irregular quadrilaterals shown in FIG. 6, or rectangles shown in FIG. 8*d*. That is, in the embodiment, each of a plurality of first openings 51 formed in a mask base 5 corresponds to one of the first sub-pixels in each pixel unit 1 (see FIG. 8*a*); each of a plurality of second openings 52 formed in the mask base 5 corresponds to one of the second sub-pixels in each pixel unit 1 (see FIG. 8*b*); each of a plurality of third openings 53 formed in the mask base 5 corresponds to one of the third sub-pixels in each pixel unit 1 (see FIG. 8*c*), or corresponds to all the third sub-pixels in each pixel unit 1 (see FIG. 8*d*). Since the shapes of the orthographic projections of the anode layers 101 of the third sub-pixels on the display panel are the same as the shapes of the orthographic projections of the third sub-pixels on the display panel, using the mask having rectangular openings for evaporating the light-emitting functional layers 102 of the third sub-pixels does not affect shapes of light-emitting regions of the third sub-pixels for emitting light, which may ensure accurate control of the luminous efficiency of the third sub-pixels; in addition, it is relatively easy to form the anode layers 101 into various regular or irregular shapes by a patterning process; furthermore, using the mask having the rectangular openings for evaporating the light-emitting functional layers 102 of the third sub-pixels may reduce the process difficulty in the fabrication and the tensioning of the mask used for the evaporation of the light-emitting functional layers.

In the embodiment, according to the above arrangement of the pixel units 1 of the display panel, along the column direction L of the array, the minimum distance d and the maximum distance e exist between the third sub-pixels 13 adjacent to each other in the adjacent pixel units 1; for any adjacent pixel units 1, the second sub-pixel 12 of the former pixel unit 1 and the first sub-pixel 11 of the latter pixel unit 1, which are adjacent to each other, are kept apart by the first distance a; and the first distance a is greater than the minimum distance d and less than the maximum distance e. In this way, the solid color image (e.g., a red or green image) can be presented well, the visual resolution can be guaranteed, the diagonal continuity is good, and the single-pixel black or white point can be displayed; moreover, the opening area of each sub-pixel of the pixel units can be increased, so that the process difficulty in the fabrication and the tensioning of the mask used for the evaporation of the light-emitting functional layers can be reduced.

In some implementations, with reference to FIG. 3 and FIG. 6, each pixel unit 1 includes a sub-unit including one first sub-pixel 11, one second sub-pixel 12 and one third sub-pixel 13; the first sub-pixel 11 and the second sub-pixel 12 are arranged along the column direction L of the array to form a first sub-column; a length direction of the third sub-pixel 13 is along the column direction L of the array to form a second sub-column; and the first sub-column and the second sub-column are arranged along the row direction M of the array.

In some implementations, each pixel unit 1 includes one sub-unit.

In some implementations, within each sub-unit, the first sub-pixel 11 and the second sub-pixel 12 are kept apart by the first distance a; the first sub-pixel 11 and the third sub-pixel 13 are kept apart by the first distance a; and the second sub-pixel 12 and the third sub-pixel 13 are kept apart by the first distance a.

In some implementations, with reference to FIG. 3, the first distance a between the first sub-pixel 11 and the second sub-pixel 12 is a distance between adjacent parallel sides of the first sub-pixel 11 and the second sub-pixel 12, with the adjacent parallel sides being along the row direction M of the array. The first distance a between the first sub-pixel 11 and the third sub-pixel 13 is a distance between adjacent parallel sides of the first sub-pixel 11 and the third sub-pixel 13, with the adjacent parallel sides being along the column direction L of the array. The first distance a between the second sub-pixel 12 and the third sub-pixel 13 is a distance between adjacent parallel sides of the second sub-pixel 12 and the third sub-pixel 13, with the adjacent parallel sides being along the column direction L of the array.

In some implementations, with reference to FIG. 3 and FIG. 6, the third sub-pixels 13 adjacent to each other in the adjacent pixel units 1 are mirror symmetrical.

In some implementations, the display panel further includes a plurality of supporters 4, which are respectively disposed at positions where the maximum distance e exists between the third sub-pixels 13 adjacent to each other in the adjacent pixel units along the column direction L of the array, and are kept apart from the third sub-pixels 13. The supporters 4 are configured to support the mask during the evaporation of the light-emitting functional layers, so as to prevent the substrate to be evaporated from adhering to the mask. The supporters 4 are disposed on the pixel defining layer, and are made of the same material as the pixel defining layer, for example, may be made of a photoresist material or a resin material. Compared with the technical solution in the related art, disposing the supporters 4 at the positions where the maximum distance e exists between the third sub-pixels 13 adjacent to each other in the adjacent pixel units along the column direction L of the array obviates to arrange a relative large distance between the adjacent pixel units 1, so that the opening area of each sub-pixel of the pixel units 1 can be increased, which can not only increase the luminous efficiency of each sub-pixel, but can also reduce the process difficulty in the fabrication and the tensioning of the mask used for the evaporation of the light-emitting functional layers. In addition, areas of orthographic projections of the supporters 4, which are disposed at the positions where the maximum distance e exists, on the display panel may be set to be relatively small, so that the supporters 4 cannot be easily scratched by the mask during the evaporation of the light-emitting functional layers, thereby avoiding the problem of the contamination defect caused by the scratch.

Figure 9:
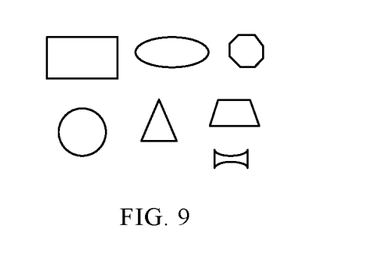
FIG. 9 is a schematic diagram of a shape of a supporter in a display panel according to the embodiments of the present disclosure.

In some implementations, with reference to FIG. 9, the shape of the orthographic projection of the supporter 4 on the display panel includes a rectangle, a circle, an ellipse, a triangle, a trapezoid, a regular polygon or an irregular shape. The shape of the orthographic projection of the supporter 4 on the display panel may be any shape that can be obtained by fabrication, and is not limited herein.

In some implementations, the driving backplane 2 includes a pixel driving circuit, which may be any driving circuit capable of driving each sub-pixel to emit light, and each film layer in the driving backplane 2 is also manufactured by conventional processes, which will not be described in detail here. When each sub-pixel is manufactured, a pattern of a mask for manufacturing the anode layer 101 is designed according to an actual pattern of the anode layer 101; a pattern of a mask for the evaporation of the light-emitting functional layer 102 is designed according to an actual pattern of the light-emitting functional layer 102, or is designed as being a rectangular shape; and other film layers of each sub-pixel are all manufactured by conventional processes without any improvement, which will not be described in detail here.

An embodiment of the present disclosure further provides a display panel. Unlike what is illustrated in the above embodiment, with reference to FIG. 10, each pixel unit 1 includes two or more sub-units 100, which are arranged along the column direction L of the array.

Figure 10:
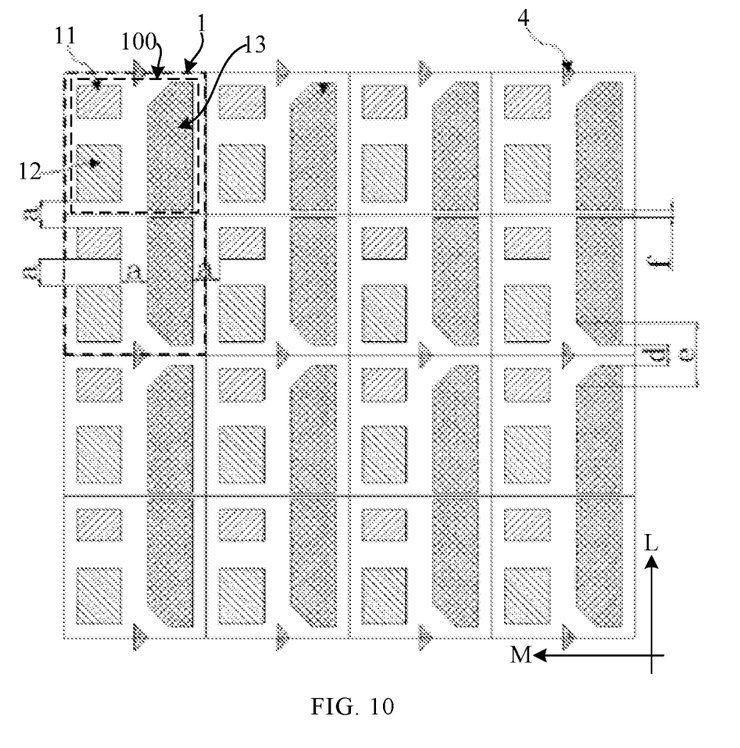
FIG. 10 is a top view of still another layout structure of pixel units of a display panel according to the embodiments of the present disclosure.

In some implementations, for any adjacent sub-units 100 within each pixel unit 1, the first sub-pixel 11 of the former sub-unit 100 and the second sub-pixel 12 of the latter sub-unit 100 are adjacent to each other and kept apart by the first distance a; and the third sub-pixel 13 of the former sub-unit 100 and the third sub-pixel 13 of the latter sub-unit 100 are kept apart by a second distance f, which is less than the minimum distance d.

In some implementations, the shapes of the orthographic projections of the first sub-pixels 11 and the second sub-pixels 12 on the display panel are all rectangles. The shapes of the orthographic projections of the third sub-pixels 13 on the display panel are pentagons, and for any adjacent sub-units 100 within each pixel unit 1, a straight side of the third sub-pixel 13 of the former sub-unit 100 and a straight side of the third sub-pixel 13 of the latter sub-unit 100 are adjacent and parallel to each other and are along the row direction M of the array, and the second distance f is a distance between such two straight sides.

Figure 11A:
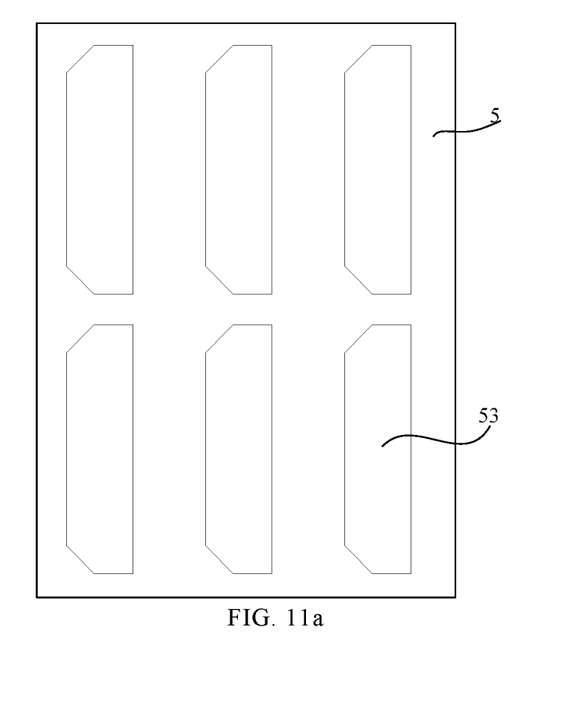
FIG. 11a is a schematic diagram of opening patterns of a mask for evaporation of light-emitting functional layers of third sub-pixels shown in FIG. 10.
Figure 11B:
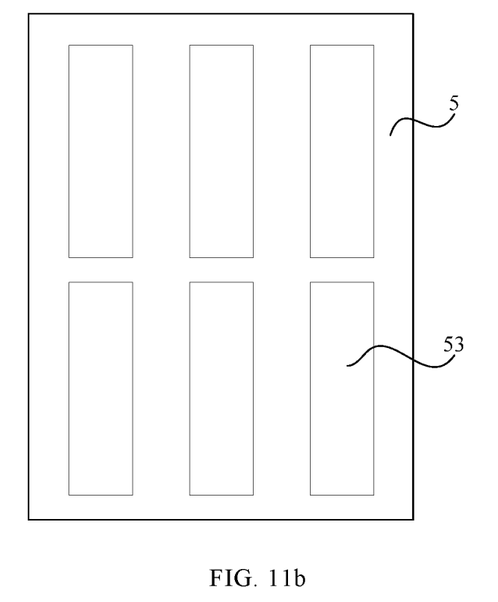
FIG. 11b is schematic diagram of opening patterns of another mask for evaporation of light-emitting functional layers of third sub-pixels shown in FIG. 10.

In some implementations, with above arrangement of the pixel units 1 of the display panel, on the one hand, areas of the light-emitting regions of the third sub-pixels 13 are increased, which increases the luminous efficiency of the third sub-pixels 13; on the other hand, with reference to FIG. 11a and FIG. 11b, the evaporation of the light-emitting functional layers of the third sub-pixels 13 of the sub-units 100 in each pixel unit 1 can be achieved through one relatively large opening in the mask, that is, when the evaporation of the light-emitting functional layers of the third sub-pixels 13 of the sub-units 100 in the pixel unit 1 is performed, the evaporation of the light-emitting functional layers of the third sub-pixels 13 of the sub-units 100 in the pixel unit 1 can be simultaneously performed through the one relatively large mask opening, so that the process difficulty in the fabrication and the tensioning of the mask used for the evaporation of the light-emitting functional layers can be further reduced; meanwhile, since the shapes of the orthographic projections of the anode layers 101 of the third sub-pixels on the display panel are respectively the same as the shapes of the orthographic projections of the third sub-pixels on the display panel, performing evaporation of the light-emitting function layers of the third sub-pixels 13 simultaneously through one relatively large mask opening does not affect the shapes of the light-emitting regions of the third sub-pixels for emitting light, so that the accurate control of the luminous efficiency of the third sub-pixels can be ensured.

In some implementations, with reference to FIG. 11a and FIG. 11b, a contour of an opening in the mask for the evaporation of the light-emitting functional layers of the third sub-pixels 13 may be the same as a contour of an overall shape formed by splicing two or more third sub-pixels 13, or may be designed in a shape of rectangle, so that the process difficulty in the fabrication and the tensioning of the mask used for the evaporation of the light-emitting functional layers can be further reduced. That is, in the embodiment, each of the plurality of third openings 53 formed in the mask base 5 corresponds to all the third sub-pixels in each pixel unit 1.

In some implementations, for any adjacent sub-units 100 within each pixel unit 1, the third sub-pixel 13 of the former sub-unit 100 and the third sub-pixel 13 of the latter sub-unit 100 are mirror symmetrical.

Other structures of the display panel in this embodiment are the same as those illustrated in the above embodiment, and will not be described in detail here.

An embodiment of the present disclosure further provides a display panel. Unlike what is illustrated in the above embodiments, with reference to FIG. 12, each pixel unit 1 includes a first sub-unit 104 and a second sub-unit 105, which are arranged along the column direction L of the array; the first sub-unit 104 includes two first sub-pixels 11 and one third sub-pixel 13; the second sub-unit 105 includes two second sub-pixels 12 and one third sub-pixel 13; within the first sub-unit 104, the two first sub-pixels 11 are arranged along the column direction L of the array to form a first sub-column, a length direction of the third sub-pixel 13 is along the column direction L of the array to form a second sub-column, and the first sub-column and the second sub-column are arranged along the row direction M of the array; within the second sub-unit 105, the two second sub-pixels 12 are arranged along the column direction L of the array to form a third sub-column, a length direction of the third sub-pixel 13 is along the column direction L of the array to form a fourth sub-column, and the third sub-column and the fourth sub-column are arranged along the row direction M of the array; the first sub-column and the third sub-column are located in a same column; and the second sub-column and the fourth sub-column are located in a same column.

Figure 12:
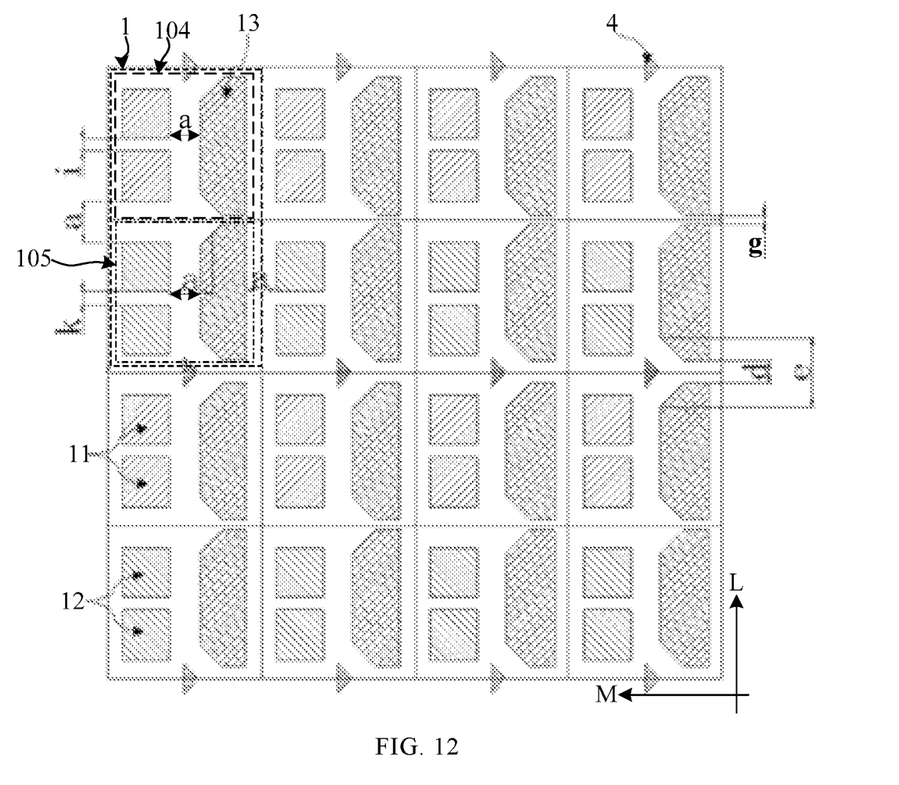
FIG. 12 is a top view of yet another layout structure of pixel units of a display panel according to the embodiments of the present disclosure.

In some implementations, the first sub-pixel 11 in the first sub-unit 104 and the second sub-pixel 12 in the second sub-unit 105 are kept apart by the first distance a; within the first sub-unit 104, the first sub-pixel 11 is kept apart from the third sub-pixel 13 by the first distance a; and within the second sub-unit 105, the second sub-pixel 12 is kept apart from the third sub-pixel 13 by the first distance a.

In some implementations, the shapes of the orthographic projections of the first sub-pixels 11 and the second sub-pixels 12 on the display panel are all rectangles, and the shapes of the orthographic projections of the third sub-pixels 13 on the display panel are hexagons. The first distance a between the first sub-pixel 11 in the first sub-unit 104 and the second sub-pixel 12 in the second sub-unit 105 is a distance between adjacent and parallel straight sides of the first sub-pixel 11 and the second sub-pixel 12, with the adjacent and parallel straight sides being along the row direction M of the array; the first distance a between the first sub-pixel 11 and the third sub-pixel 13 in the first sub-unit 104 is a distance between adjacent and parallel straight sides of the first sub-pixel 11 and the third sub-pixel 13, with the adjacent and parallel straight sides being along the column direction L of the array; and the first distance a between the second sub-pixel 12 and the third sub-pixel 13 in the second sub-unit 105 is a distance between adjacent and parallel straight sides of the second sub-pixel 12 and the third sub-pixel 13, with the adjacent and parallel straight sides being along the column direction L of the array.

In some implementations, the two first sub-pixels 11 in the first sub-unit 104 are kept apart by a third distance i; the two second sub-pixels 12 in the second sub-unit 105 are kept apart by a fourth distance k; and the third sub-pixel 13 in the first sub-unit 104 and the third sub-pixel 13 in the second sub-unit 105 are kept apart by a fifth distance g. The third distance i between the two first sub-pixels 11 in the first sub-unit 104 is a distance between adjacent and parallel straight sides of the two first sub-pixels 11, with the adjacent and parallel straight sides being along the row direction M of the array. The fourth distance k between the two second sub-pixels 12 in the second sub-unit 105 is a distance between adjacent and parallel straight sides of the two second sub-pixels 12, with the adjacent and parallel straight sides being along the row direction M of the array. The fifth distance g between the third sub-pixel 13 in the first sub-unit 104 and the third sub-pixel 13 in the second sub-unit 105 is a distance between adjacent and parallel straight sides of the two third sub-pixels 13, with the adjacent and parallel straight sides being along the row direction M of the array.

In some implementations, each of the third distance i, the fourth distance k and the fifth distance g is less than the minimum distance d. With such setting, on the one hand, an area of a light-emitting region of each of the first sub-pixels 11, the second sub-pixels 12 and the third sub-pixels 13 is increased, so that the luminous efficiency of each of the first sub-pixels 11, the second sub-pixels 12 and the third sub-pixels 13 is increased; on the other hand, with reference to FIG. 13a, FIG. 13b and FIG. 13c, evaporation of light-emitting functional layers of the first sub-pixels 11 of the first sub-unit 104 and the second sub-unit 105 of each pixel unit 1 can be achieved through one relatively large opening in a mask; evaporation of light-emitting functional layers of the second sub-pixels 12 of the first sub-unit 104 and the second sub-unit 105 of each pixel unit 1 can be achieved through one relatively large opening in a mask; evaporation of light-emitting functional layers of the third sub-pixels 13 of the first sub-unit 104 and the second sub-unit 105 of each pixel unit 1 can be achieved through one relatively large opening in a mask, that is, when the evaporation of the light-emitting functional layers of the first sub-pixels, the second sub-pixels and the third sub-pixels of the first sub-unit 104 and the second sub-unit 105 of each pixel unit 1 is performed, the evaporation of the light-emitting functional layers of the first sub-pixels, the second sub-pixels or the third sub-pixels can be simultaneously performed through one relatively large mask opening, so that the process difficulty in the fabrication and the tensioning of the mask used for the evaporation of the light-emitting functional layers can be further reduced; meanwhile, since shapes of orthographic projections of anode layers of the first sub-pixels, the second sub-pixels and the third sub-pixels on the display panel are respectively the same as the shapes of the orthographic projections of the first sub-pixels, the second sub-pixels and the third sub-pixels on the display panel, performing evaporation of light-emitting function layers of a plurality of sub-pixels in a same color simultaneously through one relatively large mask opening does not affect shapes of light-emitting regions of the sub-pixels for emitting light, so that the accurate control of the luminous efficiency of the sub-pixels can be ensured.

Figure 13A:
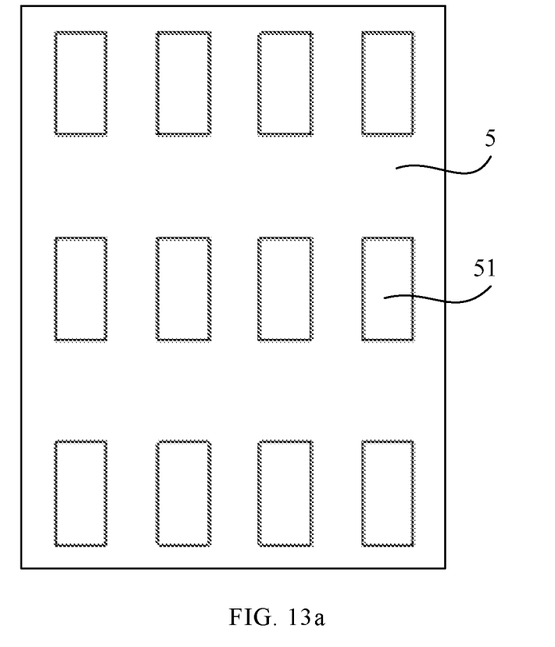
FIG. 13a is a schematic diagram of opening patterns of a mask for evaporation of light-emitting functional layers of first sub-pixels shown in FIG. 12.
Figure 13B:
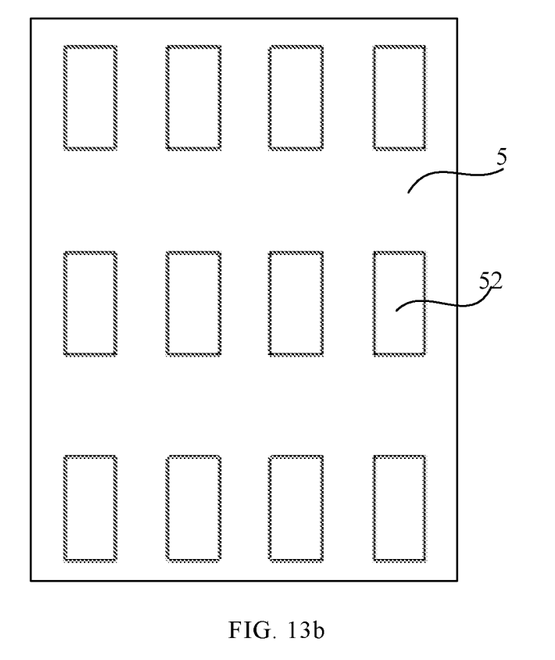
FIG. 13b is a schematic diagram of opening patterns of a mask for evaporation of light-emitting functional layers of second sub-pixels shown in FIG. 12.
Figure 13C:
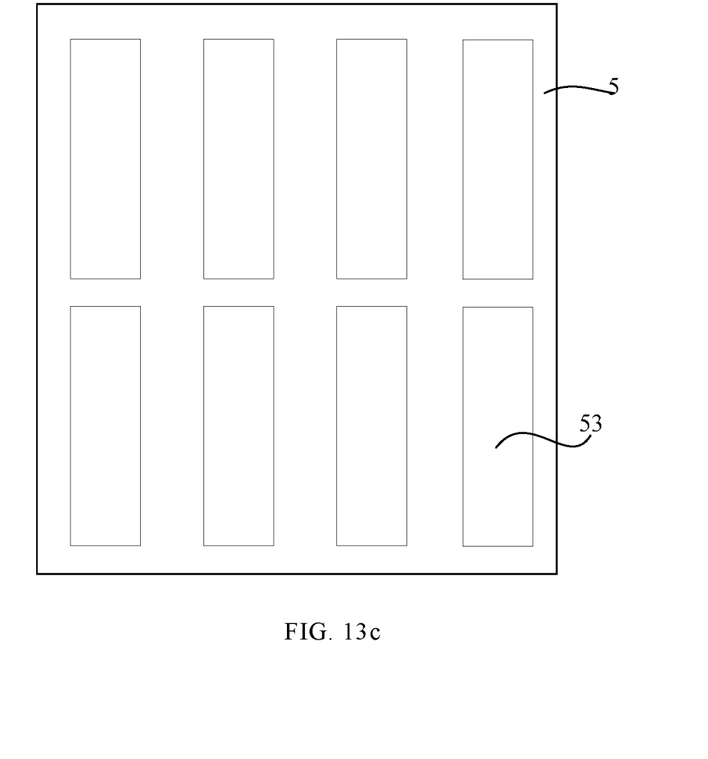
FIG. 13c is a schematic diagram of opening patterns of a mask for evaporation of light-emitting functional layers of third sub-pixels shown in FIG. 12.

In some implementations, with reference to FIG. 13a to FIG. 13c, a contour of an opening in the mask for the evaporation of the light-emitting functional layers of the first sub-pixels 11 is the same as a contour of an overall shape formed by splicing the two first sub-pixels 11, for example, the contour of the opening is in a shape of rectangle; a contour of an opening in the mask for the evaporation of the light-emitting functional layers of the second sub-pixels 12 is the same as a contour of an overall shape formed by splicing the two second sub-pixels 12, for example, the contour of the opening is in a shape of rectangle; and a contour of an opening in the mask for the evaporation of the light-emitting functional layers of the third sub-pixels 13 may be the same as a contour of an overall shape formed by splicing the two third sub-pixels 13, or may be designed in a shape of rectangle. In this way, the process difficulty in the fabrication and the tensioning of the mask used for the evaporation of the light-emitting functional layers can be further reduced. That is, in the embodiment, each of the plurality of first openings 51 formed in the mask base 5 corresponds to all the first sub-pixels in each pixel unit 1 (see FIG. 13a); each of the plurality of second openings 52 formed in the mask base 5 corresponds to all the second sub-pixels in each pixel unit 1 (see FIG. 13b); and each of the plurality of third openings 53 formed in the mask base 5 corresponds to all the third sub-pixels in each pixel unit 1 (see FIG. 13c).

In some implementations, each of the third distance i, the fourth distance k and the fifth distance g is equal to the first distance a. With such setting, the first sub-pixels 11 and the third sub-pixel 13 in the first sub-unit 104 and the second sub-pixels 12 and the third sub-pixel 13 in the second sub-unit 105 in each pixel unit 1 may be respectively fabricated by evaporation.

In some implementations, the two first sub-pixels 11 in the first sub-unit 104 are mirror symmetrical; the two second sub-pixels 12 in the second sub-unit 105 are mirror symmetrical; and the third sub-pixel 13 in the first sub-unit 104 and the third sub-pixel 13 in the second sub-unit 105 are mirror symmetrical.

In some implementations, each pixel unit 1 includes a plurality of first sub-units 104 and a plurality of second sub-units 105, and the first sub-units 104 and the second sub-units 105 are alternately arranged along the column direction L of the array.

Other structures of the display panel in this embodiment are the same as those illustrated in the above embodiments, and will not be described in detail here.

As for the display panel provided by the above embodiments, with the arrangement of the pixel units provided by each embodiment, along the column direction of the array, the minimum distance and the maximum distance exist between the third sub-pixels adjacent to each other in the adjacent pixel units; for any adjacent pixel units, the second sub-pixel of the former pixel unit and the first sub-pixel of the latter pixel unit, which are adjacent to each other, are kept apart by the first distance; and the first distance is greater than the minimum distance and less than the maximum distance. In this way, the solid color image (e.g., the red or green image) can be presented well, the visual resolution can be guaranteed, the diagonal continuity is good, and the single-pixel black or white point can be displayed; moreover, the opening area of each sub-pixel of the pixel units can be increased, so that the process difficulty in the fabrication and the tensioning of the mask used for the evaporation of the light-emitting functional layers can be reduced.

An embodiment of the present disclosure further provides a display device, including the display panel described in any one of the above embodiments.

By adopting the display panel described in any one of the above embodiments, a display effect of the display device is improved, and meanwhile a manufacturing difficulty of the display device is reduced.

The display device provided by the embodiment of the present disclosure may be any product or component with a display function, such as an OLED panel, an OLED television, a monitor, a mobile phone, a navigator or the like.

An embodiment of the present disclosure further provides a mask including a base; and a plurality of first openings are formed in the base, or a plurality of second openings are formed in the base, or a plurality of third openings are formed in the base. Each of the plurality of first openings corresponds to one of first sub-pixels in each pixel unit; each of the plurality of second openings corresponds to one of second sub-pixels in each pixel unit; each of the plurality of third openings corresponds to one of third sub-pixels in each pixel unit. Thus, light-emitting functional layers of the first sub-pixels, the second sub-pixels and the third sub-pixels are respectively evaporated.

In some implementations, each of the plurality of first openings corresponds to all the first sub-pixels in each pixel unit; each of the plurality of second openings corresponds to all the second sub-pixels in each pixel unit; and each of the plurality of third openings corresponds to all the third sub-pixels in each pixel unit. Thus, the light-emitting functional layers of the first sub-pixels, the second sub-pixels and the third sub-pixels are respectively evaporated. In this way, the process difficulty in the fabrication and the tensioning of the mask used for the evaporation of the light-emitting functional layers can be reduced to a certain extent, and meanwhile an opening area of each sub-pixel in the pixel units can be increased.

The mask provided by the embodiment of the present disclosure can be used for the evaporation of the light-emitting functional layer of each sub-pixel in the display panel described in the above embodiments.

It should be understood that the above embodiments are merely exemplary embodiments adopted to illustrate the principle of the present disclosure, and the present disclosure is not limited thereto. Various modifications and improvements may be made by those of ordinary sill in the art without departing from the spirit and essence of the present disclosure, and these modifications and improvements are considered to fall within the scope of the present disclosure.

What is claimed is:

1. A display panel, comprising: a plurality of pixel units arranged in an array;
    each of the pixel units comprises a first sub-pixel, a second sub-pixel and a third sub-pixel; and the first sub-pixel, the second sub-pixel and the third sub-pixel emit light of different colors and have areas sequentially increased;
    along a column direction of the array, for any adjacent pixel units, the second sub-pixel of the former pixel unit is arranged adjacent to the first sub-pixel of the latter pixel unit; and third sub-pixels in the adjacent pixel units are arranged in sequence;
    wherein, along the column direction of the array, a minimum distance and a maximum distance exist between the third sub-pixels adjacent to each other in the adjacent pixel units; and for any adjacent pixel units, the second sub-pixel of the former pixel unit and the first sub-pixel of the latter pixel unit, adjacent to each other, are kept apart by a first distance; and
    the first distance is greater than the minimum distance and less than the maximum distance.

2. The display panel of claim 1, wherein each of the pixel units comprises a sub-unit;
    the sub-unit comprises one first sub-pixel, one second sub-pixel and one third sub-pixel;
    wherein the first sub-pixel and the second sub-pixel are arranged along the column direction of the array to form a first sub-column; a length direction of the third sub-pixel is along the column direction of the array to form a second sub-column; and the first sub-column and the second sub-column are arranged along a row direction of the array.

3. The display panel of claim 2, wherein each of the pixel units comprises one sub-unit, two or more sub-units; and
the two or more sub-units are arranged along the column direction of the array.

4. The display panel of claim 3, wherein, within each sub-unit, the first sub-pixel and the second sub-pixel are kept apart by the first distance; the first sub-pixel and the third sub-pixel are kept apart by the first distance; and the second sub-pixel and the third sub-pixel are kept apart by the first distance.

5. The display panel of claim 3, wherein, for any adjacent sub-units within each of the pixel units, the first sub-pixel in the former sub-unit and the second sub-pixel of the latter sub-unit are adjacent to each other and kept apart by the first distance; and
the third sub-pixel of the former sub-unit and the third sub-pixel of the latter sub-unit are kept apart by a second distance, which is less than the minimum distance.

6. The display panel of claim 5, wherein, for any adjacent sub-units within each of the pixel units, the third sub-pixel of the former sub-unit and the third sub-pixel of the latter sub-unit are mirror symmetrical.

7. The display panel of claim 1, wherein each of the pixel units comprises a first sub-unit and a second sub-unit, which are arranged along the column direction of the array;
the first sub-unit comprises two first sub-pixels and one third sub-pixel;
the second sub-unit comprises two second sub-pixels and one third sub-pixel;
wherein, within the first sub-unit, the two first sub-pixels are arranged along the column direction of the array to form a first sub-column; a length direction of the third sub-pixel is along the column direction of the array to form a second sub-column; and the first sub-column and the second sub-column are arranged along a row direction of the array;
within the second sub-unit, the two second sub-pixels are arranged along the column direction of the array to form a third sub-column; a length direction of the third sub-pixel is along the column direction of the array to form a fourth sub-column; and the third sub-column and the fourth sub-column are arranged along the row direction of the array; and
the first sub-column and the third sub-column are located in a same column; and the second sub-column and the fourth sub-column are located in a same column.

8. The display panel of claim 7, wherein the first sub-pixel in the first sub-unit and the second sub-pixel in the second sub-unit are kept apart by the first distance;
within the first sub-unit, each of the first sub-pixels is kept apart from the third sub-pixel by the first distance; and
within the second sub-unit, each of the second sub-pixels is kept apart from the third sub-pixel by the first distance.

9. The display panel of claim 8, wherein the two first sub-pixels in the first sub-unit are kept apart by a third distance;
the two second sub-pixels in the second sub-unit are kept apart by a fourth distance; and
the third sub-pixel in the first sub-unit and the third sub-pixel in the second sub-unit are kept apart by a fifth distance.

10. The display panel of claim 9, wherein each of the third distance, the fourth distance and the fifth distance is less than the minimum distance.

11. The display panel of claim 9, wherein each of the third distance, the fourth distance and the fifth distance is equal to the first distance.

12. The display panel of claim 7, wherein the two first sub-pixels in the first sub-unit are mirror symmetrical;
the two second sub-pixels in the second sub-unit are mirror symmetrical; and
the third sub-pixel in the first sub-unit and the third sub-pixel in the second sub-unit are mirror symmetrical.

13. The display panel of claim 7, wherein each of the pixel units comprises a plurality of first sub-units and a plurality of second sub-units, and the first sub-units and the second sub-units are alternately arranged along the column direction of the array.

14. The display panel of claim 1, wherein the third sub-pixels adjacent to each other in the adjacent pixel units are mirror symmetrical.

15. The display panel of claim 1, wherein a shape of an orthographic projection of the first sub-pixel on the display panel comprises a rectangle, a triangle, a diamond or a trapezoid;
a shape of an orthographic projection of the second sub-pixel on the display panel comprises a rectangle, a triangle, a diamond or a trapezoid; and
a shape of an orthographic projection of the third sub-pixel on the display panel comprises a rectangle, a triangle, a diamond, a trapezoid, a polygon or an irregular shape.

16. The display panel of claim 1, further comprising a plurality of supporters respectively disposed at positions where the maximum distance exists between the third sub-pixels adjacent to each other in the adjacent pixel units along the column direction of the array.

17. The display panel of claim 16, wherein a shape of an orthographic projection of each of the supporters on the display panel comprises a rectangle, a circle, an ellipse, a triangle, a trapezoid, a regular polygon or an irregular shape.

18. The display panel of claim 15, wherein each of the first sub-pixel, the second sub-pixel and the third sub-pixel comprises an anode layer, a light-emitting functional layer and a cathode layer, which are sequentially stacked;
anode layers of the first sub-pixel, the second sub-pixel and the third sub-pixel are independent of one another, light-emitting functional layers of the first sub-pixel, the second sub-pixel and the third sub-pixel are independent of one another, and cathode layers of the first sub-pixel, the second sub-pixel and the third sub-pixel are connected into one piece; and
shapes of orthographic projections of the anode layers of the first sub-pixel, the second sub-pixel and the third sub-pixel on the display panel are respectively the same as those of orthographic projections of the first sub-pixel, the second sub-pixel and the third sub-pixel on the display panel.

19. A display device, comprising the display panel of claim 1.

* * * * *